United States Patent
Yoon et al.

(10) Patent No.: US 9,984,807 B2
(45) Date of Patent: May 29, 2018

(54) COIL COMPONENT AND BOARD HAVING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 5 days.

(21) Appl. No.: 15/229,366

(22) Filed: Aug. 5, 2016

(65) Prior Publication Data
US 2017/0148561 A1 May 25, 2017

(30) Foreign Application Priority Data
Nov. 19, 2015 (KR) .................. 10-2015-0162400

(51) Int. Cl.
*H01F 5/00* (2006.01)
*H01F 27/28* (2006.01)
(Continued)

(52) U.S. Cl.
CPC ....... *H01F 27/2804* (2013.01); *H01F 27/022* (2013.01); *H01F 27/255* (2013.01);
(Continued)

(58) Field of Classification Search
CPC ........ H01F 5/00; H01F 27/28; H01F 27/2804; H01F 27/255; H01F 27/292
(Continued)

(56) References Cited

U.S. PATENT DOCUMENTS

2003/0137384 A1* 7/2003 Itou ............... H01F 17/0013
336/200
2005/0181684 A1* 8/2005 Ito ................. H05K 3/3442
439/894
(Continued)

FOREIGN PATENT DOCUMENTS

JP H10-270256 A 10/1998
JP 2007-067214 A 3/2007
(Continued)

OTHER PUBLICATIONS

Korean Office Action dated Nov. 10, 2016 issued in Korean Patent Application No. 10-2015-0162400 (with English translation).

*Primary Examiner* — Tsz Chan
(74) *Attorney, Agent, or Firm* — McDermott Will & Emery LLP (57) ABSTRACT

A coil component includes: a first coil and a second coil; a first magnetic region embedding the first coil therein and a second magnetic region embedding the second coil therein; a magnetic body embedding the first and second magnetic regions therein; first and second external electrodes disposed on external surfaces of the magnetic body and connected to a first end portion and a second end portion of the first coil, respectively; and third and fourth external electrodes disposed on the external surfaces of the magnetic body and connected to a first end portion and a second end portion of the second coil, respectively.

19 Claims, 5 Drawing Sheets

(51) Int. Cl.
*H01F 27/255* (2006.01)
*H05K 1/18* (2006.01)
*H01F 27/02* (2006.01)
*H01F 27/29* (2006.01)
*H05K 3/34* (2006.01)

(52) U.S. Cl.
CPC ........... *H05K 1/181* (2013.01); *H01F 27/292* (2013.01); *H01F 2027/2809* (2013.01); *H05K 3/3431* (2013.01); *H05K 2201/1003* (2013.01)

(58) Field of Classification Search
USPC .................................................. 336/200, 232
See application file for complete search history.

(56) References Cited

U.S. PATENT DOCUMENTS

2008/0290977 A1 11/2008 Ito et al.
2011/0279100 A1* 11/2011 Ikriannikov .......... H02M 7/003
 323/271
2012/0105188 A1* 5/2012 Lim .................... H01F 17/0033
 336/200

FOREIGN PATENT DOCUMENTS

| JP | 2007067214 A | * | 3/2007 | |
| JP | 2009-129937 A | | 6/2009 | |
| JP | 2014216511 A | * | 11/2014 | ............ H01F 27/02 |
| KR | 10-2003-0063135 A | | 7/2003 | |
| KR | 10-2008-0102993 A | | 11/2008 | |
| KR | 10-1558092 B1 | | 10/2015 | |

* cited by examiner

COIL COMPONENT AND BOARD HAVING THE SAME

CROSS-REFERENCE TO RELATED APPLICATION

This application claims the benefit of priority to Korean Patent Application No. 10-2015-0162400, filed on Nov. 19, 2015 with the Korean Intellectual Property Office, the entirety of which is incorporated herein by reference.

BACKGROUND

The present disclosure relates to a coil component and a board having the same.

Electronic devices such as digital TVs, mobile phones and notebook computers transmit and receive data, commonly undertaken using signals within a high frequency bandwidth, and it is anticipated that such information technology (IT) electronic devices will increasingly utilize high frequencies and will be connected using USB ports or other communications ports in line with the increasing multifunctionality and complexity thereof.

In accordance with the development of smartphones, demand has increased for a thinned power inductor having high capacitance, high efficiency, high performance, and a small size.

Therefore, a product ranging from a 2520-sized product having a thickness of 1 mm to a 2016-sized product having a thickness of 1 mm have been used, and will be miniaturized for use in a 1608-sized product having a thickness of 0.8 mm.

At the same time, demand has also increased for an inductor array having an advantage such as a decreased mounting area.

The inductor array may have the form of a non-coupled inductor array, a coupled inductor array or a mixture of the non-coupled inductor array and the coupled inductor array, depending on a coupling coefficient or a level of mutual inductance between a plurality of coil parts.

In the case of a non-coupled inductor array in which a plurality of coils are disposed to be spaced apart from each other, such that they are not respectively affected by the others' magnetic flux, when levels of inductance of the respective coils have the same level as each other, a mounting area may be decreased, and efficiency of the non-coupled inductor array may be increased.

In a non-coupled inductor array, it is important to significantly decrease a level of mutual inductance by decreasing a coupling coefficient between two coils. In a case in which the coupling coefficient between the two coils is equal to a specific value or more, a voltage rise phenomenon in a micro-current region is generated due to the mutual inductance between the two coils. The coupling coefficient between the two coils should be decreased in order to prevent the voltage rise phenomenon in the micro-current region.

An interval between the two coils should be increased in order to decrease the coupling coefficient between the two coils. However, it is difficult to continuously increase the interval between the two coils due to a limitation in a chip size.

SUMMARY

An aspect of the present disclosure provides a coil component having a low coupling coefficient, and a board having the same.

According to an aspect of the present disclosure, a coil component includes: first and second magnetic regions embedding and enclosing first and second coils therein, respectively; a magnetic body embedding and enclosing the first and second magnetic regions therein; first and second external electrodes connected to the first coil and disposed on external surfaces of the magnetic body; and third and fourth external electrodes connected to the second coil disposed on the external surfaces of the magnetic body.

According to another aspect of the present disclosure, a board having a coil component includes: a printed circuit board having a plurality of electrode pads disposed thereon; and the coil component mounted on the printed circuit board, wherein the coil component includes: first and second magnetic regions embedding and enclosing first and second coils therein, respectively; a magnetic body embedding and enclosing the first and second magnetic regions therein; first and second external electrodes connected to the first coil and disposed on external surfaces of the magnetic body; and third and fourth external electrodes connected to the second coil and disposed on the external surfaces of the magnetic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Hereinafter, a coil component and a board having the same according to an exemplary embodiment in the present disclosure will be described. However, the present disclosure is not necessarily limited thereto.

Coil Component

Figure 1:
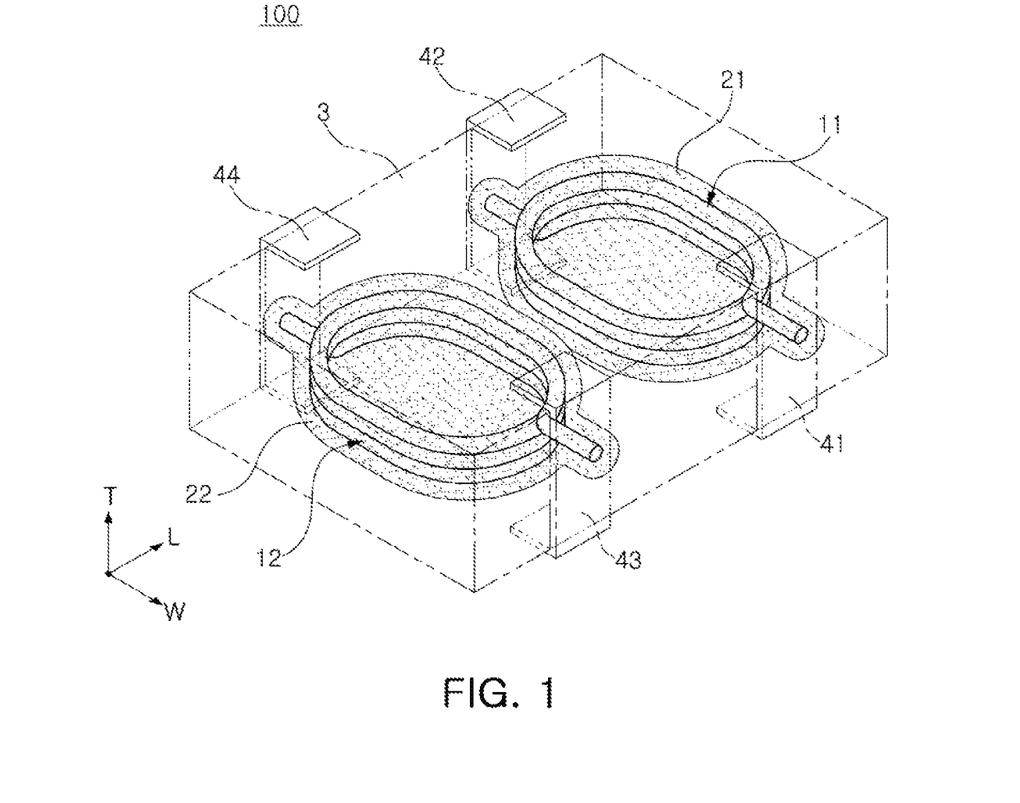
FIG. 1 is a schematic perspective view of a coil component according to an exemplary embodiment in the present disclosure.

FIG. 1 is a schematic perspective view of a coil component according to an exemplary embodiment in the present disclosure.

Referring to FIG. 1, a coil component 100 according to an exemplary embodiment in the present disclosure may include a first coil 11 and a second coil 12.

The first and second coils 11 and 12 may have a spiral shape, but are not limited thereto. In addition, a method of forming the first and second coils 11 and 12 is not particularly limited. Therefore, the first and second coils 11 and 12 may be any one of a winding type coil formed by winding a coil several times, a thin film type coil formed by performing electroplating on an insulating substrate, and a multilayer type coil formed by printing coil patterns on a plurality of magnetic sheets and then stacking the plurality of magnetic sheets on which the coil patterns are printed, but are not limited thereto.

Meanwhile, the coil component 100 may include a first magnetic region 21 embedding the first coil 11 therein and a second magnetic region 22 embedding the second coil 12 therein, and may include a magnetic body 3 simultaneously embedding the first and second magnetic regions 21 and 22 therein.

Here, the term "embed" means covering an entire external surface of a component to be embedded by an embedding component.

In detail, the first magnetic region 21 may be continuously disposed from an upper portion of external surfaces of the first coil 11 to a lower portion thereof in a thickness direction of the magnetic body 3, and the second magnetic region 22 may be continuously disposed from an upper portion of external surfaces of the second coil 12 to a lower portion thereof in the thickness direction of the magnetic body 3.

In this case, the first magnetic region 21 may be disposed to cover the entire external surfaces of the first coil 11, and the second magnetic region 22 may be disposed to cover the entire external surfaces of the second coil 12.

The first magnetic region 21 and the second magnetic region 22 may be disposed to be spaced apart from each other, and the first magnetic region 21 may have higher levels of magnetic permeability than that of the magnetic body disposed adjacently thereto, such that a flow of magnetic flux strongly induced along external surfaces adjacent to the first coil 11 may be formed, and the second magnetic region 22 may have higher levels of magnetic permeability than that of the magnetic body disposed adjacently thereto, such that a flow of magnetic flux strongly induced along external surfaces adjacent to the second coil 12 may be formed.

The magnetic permeability of the first magnetic region 21 may be larger than that of the magnetic body 3, and the magnetic permeability of the second magnetic region 22 may be larger than that of the magnetic body 3. A method of allowing the magnetic permeability of the first and second magnetic regions 21 and 22 to be larger than that of the magnetic body 3 is not particularly limited. For example, a method of allowing particle sizes of magnetic powder particles filled in the first and second magnetic regions to be larger than those of magnetic powder particles filled in the magnetic body 3, a method of allowing packing factors of the first and second magnetic regions 21 and 22 to be larger than that of the magnetic body 3, or a method of using heterogeneous materials having higher magnetic permeability in the first and second magnetic regions 21 and 22 may be used. However, the method of allowing the magnetic permeability of the first and second magnetic regions 21 and 22 to be larger than that of the magnetic body 3 is not limited thereto.

In this case, the first magnetic region 21 may prevent a phenomenon in which magnetic flux from the first coil 11 is leaked to the second coil 12 to increase a mutual inductance (Lm) between the first and second coils 11 and 12, and the second magnetic region 22 may prevent a phenomenon in which magnetic flux from the second coil 12 is leaked to the first coil 11 to increase mutual inductance (Lm) between the first and second coils 11 and 12.

As a result, the mutual inductance (Lm) between the first and second coils 11 and 12 may be decreased, such that a coupling coefficient (k) between the first and second coils 11 and 12 may be decreased.

On the other hand, leakage inductance ($L_L$) of the first coil may be increased by the first magnetic region 21 embedding the first coil 11 therein, and a leakage inductance ($L_L$) of the second coil 12 may be increased by the second magnetic region 22 embedding the second coil 12 therein.

In addition, a self-inductance (Ls) of the first coil 11 may be increased by the first magnetic region 21 disposed in the vicinity of the first coil 11 and having high magnetic permeability, and a self-inductance (Ls) of the second coil 12 may be increased by the second magnetic region 22 disposed in the vicinity of the second coil 12 and having high magnetic permeability.

The first and second magnetic regions 21 and 22 and the magnetic body 3 may contain an organic resin containing metal based soft magnetic powder particles as a filler.

In this case, the organic resin may be a thermoplastic resin or a thermosetting resin. An example of the thermosetting resin may include benzocyclobutene (BCB), an epoxy resin, a phenol resin, a vinyl ester resin, a polyimide (PI) resin, a polyvinyl benzyl ether resin, and the like. In addition, an example of the thermoplastic resin may include a polyethylene (PE) resin, a polypropylene (PP) resin, a polybutene resin, a polyvinyl alcohol resin, and the like.

The metal based soft magnetic powder may be formed of a crystalline or amorphous metal containing one or more selected from the group consisting of iron (Fe), silicon (Si), boron (B), chrome (Cr), aluminum (Al), copper (Cu), niobium (Nb), and nickel (Ni).

In addition, the magnetic powder particles contained as the filler in the organic resin may be spherical powder particles or flake-shaped powder particles.

Meanwhile, external surfaces of the magnetic body 3 in the coil component may have a hexahedral shape, and an 'L-direction' refers to a length direction of the magnetic body 3, a 'W-direction' refers to a width direction of the magnetic body 3, and a 'T-direction' refers to a thickness direction of the magnetic body 3.

The first and second coils 11 and 12 may be disposed so that a first magnetic core 111 of the first coil 11 and a second magnetic core 121 of the second coil 12 are spaced apart from a central portion of the magnetic body in the L-direction by the same distances Lc1 and Lc2.

In addition, the coil component 100 may include first to fourth external electrodes 41 to 44 disposed on the external surfaces of the magnetic body 3.

The first external electrode 41 may be connected to one end portion of the first coil 11, and the second external electrode 42 may be connected to the other end portion of the first coil 11. In addition, the third external electrode 43 may be connected to one end portion of the second coil 12, and the fourth external electrode 44 may be connected to the other end portion of the second coil 12.

Here, the first and third external electrodes 41 and 43 may be input terminals, and the second and fourth external electrodes 42 and 44 may be output terminals.

The first to fourth external electrodes 41 to 44 may be formed of a metal having excellent electrical conductivity, for example, copper (Cu), silver (Ag), nickel (Ni), tin (Sn), or the like, or alloys thereof.

Figure 2:
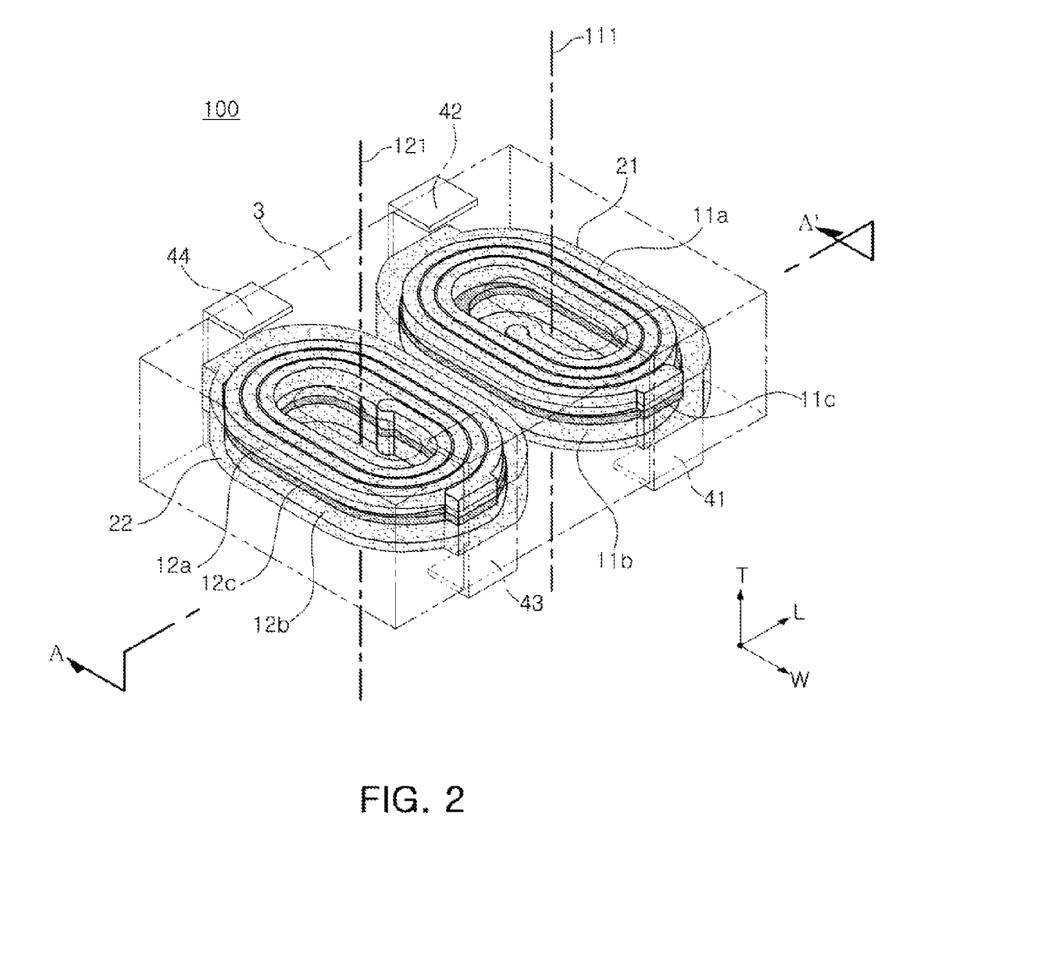
FIG. 2 is a schematic perspective view of a coil component according to a modified example of FIG. 1.
Figure 3:
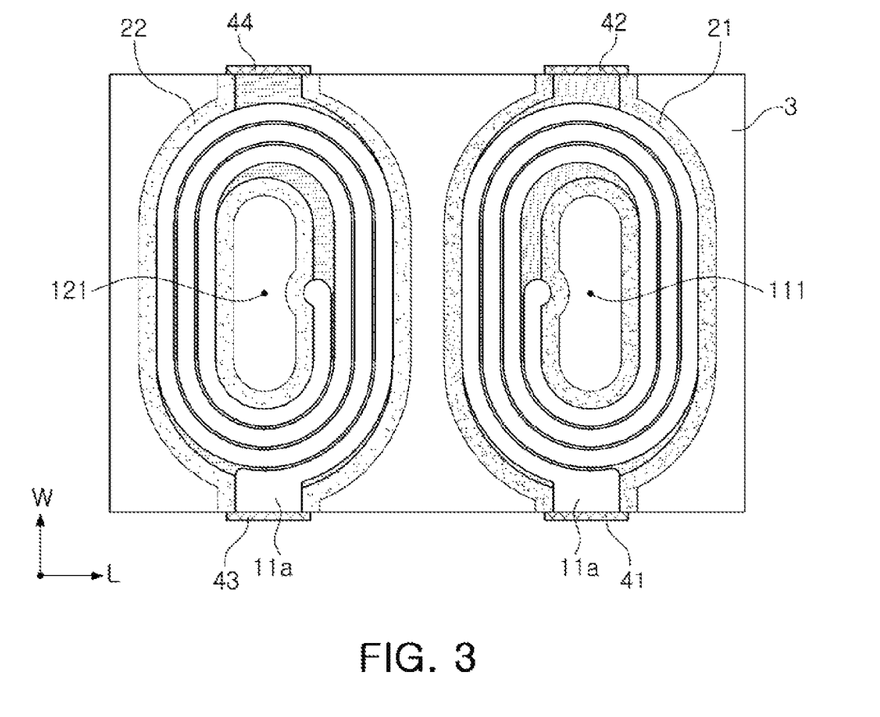
FIG. 3 is a top view of FIG. 2.
Figure 4:
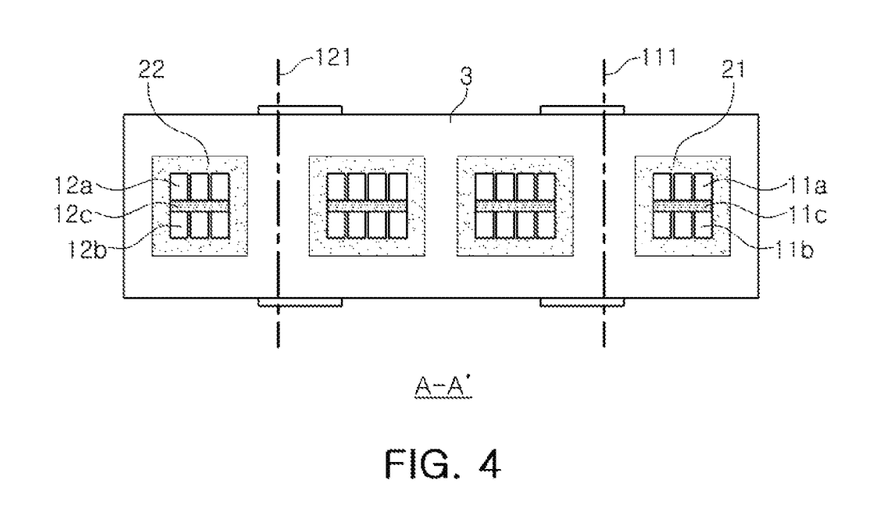
FIG. 4 is a schematic cross-sectional view taken along line A-A' of FIG. 2.

Next, FIG. 2 is a schematic perspective view of a coil component according to a modified example of FIG. 1, FIG. 3 is a top view of FIG. 2, and FIG. 4 is a schematic cross-sectional view taken along line A-A' of FIG. 2.

Referring to FIG. 2, a first coil 11 may include a first coil pattern 11a and a second coil pattern 11b with a first substrate 11c interposed therebetween, and a second coil 12 may include a third coil pattern 12a and a fourth coil pattern 12b with a second substrate 12c interposed therebetween.

Referring to FIG. 2, one end portion of the first coil pattern 11a of the first coil may be connected to the first external electrode 41, and one end portion of the second coil pattern 11b of the first coil may be connected to the second external electrode 42. The first coil pattern 11a may be electrically connected to the second coil pattern 11b by a via penetrating through the first substrate 11c.

In addition, one end portion of the third coil pattern 12a of the second coil may be connected to the third external electrode 43, and one end portion of the fourth coil pattern 21b of the second coil may be connected to the fourth external electrode 44. The third coil pattern 12a may be electrically connected to the fourth coil pattern 12b by a via penetrating through the second substrate 12c.

The first and third external electrodes 41 and 43 may be input terminals, and the second and fourth external electrodes 42 and 44 may be output terminals. In detail, a current input from the first external electrode 41, the input terminal, may pass through the first coil pattern 11a, the via penetrating through the first substrate, and the second coil pattern 11b, and then flow to the second external electrode 42, the output terminal. Likewise, a current input from the third external electrode 43, the input terminal, may pass through the third coil pattern 12a, the via penetrating through the second substrate, and the fourth coil pattern 12b, and then flow to the fourth external electrode 44, the output terminal.

Referring to FIG. 3, the first and second external electrodes 41 and 42 may be disposed on end portions of the magnetic body in the L-direction, respectively, a virtual line connecting the first external electrode 41 and the second external electrode 42 to each other may be perpendicular to the first magnetic core 111, the third and fourth external electrodes 43 and 44 may be disposed on end portions of the magnetic body in the L-direction, respectively, and a virtual line connecting the third external electrode 43 and the fourth external electrode 44 to each other may be perpendicular to the second magnetic core 121.

Meanwhile, the first and second coil patterns 11a and 11b may be formed by performing electroplating on the first substrate, and the third and fourth coil patterns 12a and 12b may be formed by performing electroplating on the second substrate. However, the first to fourth coil patterns are not necessarily limited thereto.

The first to fourth coil patterns, the via penetrating through the first substrate, and the via penetrating through the second substrate may be formed of a metal having excellent electrical conductivity, for example, silver (Ag), palladium (Pd), aluminum (Al), nickel (Ni), titanium (Ti), gold (Au), copper (Cu), platinum (Pt), or alloys thereof.

The first and second substrates may be, for example, polypropylene glycol (PPG) substrates, ferrite substrates, metal based soft magnetic substrates, or the like.

In addition, referring to FIG. 4, regions of external surfaces of the first and second coil patterns 11a and 11b and the first substrate 11c interposed between the first and second coil patterns 11a and 11b may be embedded in the first magnetic region 21, and regions of external surfaces of the third and fourth coil patterns 12a and 12b and the second substrate 12c interposed between the third and fourth coil patterns 12a and 12b may be embedded in the second magnetic region 22. In this case, the first coil and the first magnetic region embedding the first coil and the second coil and the second magnetic region embedding the second coil may be symmetrical to each other in relation to a central portion of the magnetic body 3 of the coil component in the L-direction. Here, a term 'symmetrical' means that materials and structures of the first and second coils, areas of the first and second magnetic regions, and the like, are the same as each other in relation to the central axis of the magnetic body of in the L-direction.

The first magnetic core 111 of the first coil 11 including the first and second coil patterns may correspond to the magnetic body 3, which means that a through-hole of the first substrate having the first magnetic core formed therein is filled with the organic resin contained in the magnetic body and containing the metal based soft magnetic powder particles as the filler. Likewise, the second magnetic core 121 of the second coil 12 including the third and fourth coil patterns may correspond to the magnetic body 3, which means that a through-hole of the second substrate having the second magnetic core formed therein is filled with the organic resin contained in the magnetic body and containing the metal based soft magnetic powder particles as the filler.

Figure 5A:
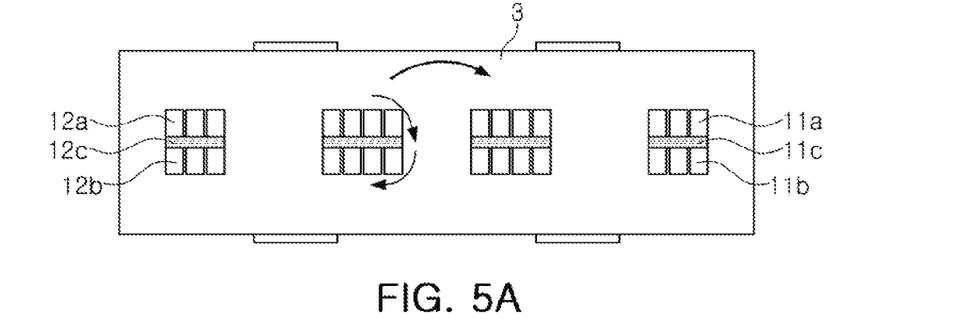
FIG. 5A is a cross-sectional view schematically illustrating leakage inductance ($L_L$) and a mutual inductance (Lm) in a self-inductance (Ls) flowing in a coil component according to the related art by arrows.

FIG. 5A is a cross-sectional view schematically illustrating leakage inductance ($L_L$) and a mutual inductance (Lm) in a self-inductance (Ls) flowing in a coil component according to the related art by arrows.

Figure 5B:
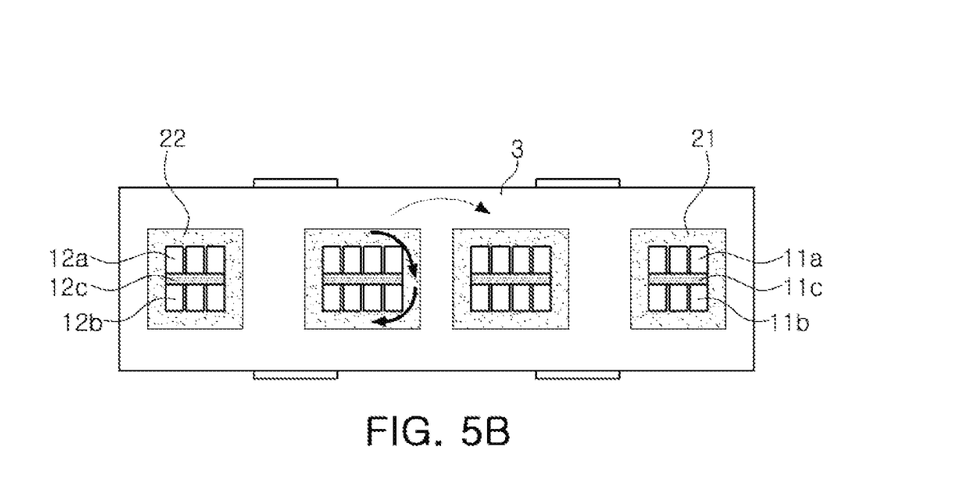
FIG. 5B is a cross-sectional view schematically illustrating leakage inductance ($L_L$) and a mutual inductance (Lm) in a self-inductance (Ls) flowing in a coil component according to an exemplary embodiment in the present disclosure by arrows.

FIG. 5B is a cross-sectional view schematically illustrating leakage inductance ($L_L$) and a mutual inductance (Lm) in a self-inductance (Ls) flowing in a coil component according to an exemplary embodiment in the present disclosure by arrows.

As seen in FIGS. 5A and 5B, a level of mutual inductance between the first and second coils 11 and 12 of the coil component according to an exemplary embodiment in the present disclosure may be lower than a level of mutual inductance between first and second coils 11 and 12 of a coil component according to the related art.

Since the first coil 11 of the coil component according to an exemplary embodiment in the present disclosure is enclosed by the first magnetic region 21 having the higher level of magnetic permeability than that of the magnetic body 3, most of the magnetic flux from the first coil 11 flows to the first magnetic region, such that the leakage inductance ($L_L$) of the first coil 11 is increased and magnetic flux flowing to the second coil 12 disposed to be spaced apart from the first coil 11 is relatively decreased.

Likewise, the reason is that since the second coil 12 of the coil component according to an exemplary embodiment in the present disclosure is also enclosed by the second magnetic region 22 having the higher levels of magnetic permeability than that of the magnetic body 3, most of the magnetic flux from the second coil 12 flows to the second magnetic region, such that the leakage inductance ($L_L$) of the second coil 12 is increased and magnetic flux flowing to the first coil 11 disposed to be spaced apart from the second coil 12 is relatively decreased.

In addition, in the coil component according to an exemplary embodiment in the present disclosure, the first and second coils 11 and 12 are enclosed, respectively, by the first and second magnetic regions 21 and 22 having the higher levels of magnetic permeability than that of the magnetic body 3, such that the levels of self-inductance (Ls) of the first and second coils 11 and 12 may be increased.

Table 1 represents levels of self-inductance, direct current (DC) resistance (Rdc), and coupling coefficients of a coil component (Inventive Example 1) according to an exemplary embodiment in the present disclosure and a coil component (Comparative Example 1) according to the related art.

The coil component according to Comparative Example 1 of Table 1 has the same structure as that of the coil component according to Inventive Example 1 except that the first and second magnetic regions enclosing the first and second coils, respectively, and having the higher levels of magnetic permeability than that of the magnetic body are not disposed.

In addition, materials and shapes of the first and second coils of the coil component according to Inventive Example 1 are the same as those of the first and second coils of the coil component according to Comparative Example 1, and materials and shapes of the first and second magnetic regions of the coil component according to Inventive Example 1 are the same as each other.

TABLE 1

|  | Inventive Example 1 | | Comparative Example 1 | |
| --- | --- | --- | --- | --- |
|  | First Coil | Second Coil | First Coil | Second Coil |
| Self-Inductance [µH] | 0.950 | 0.950 | 1.041 | 1.041 |
| Rdc [mOhm] | 35.53 | 35.53 | 35.53 | 35.53 |
| Coupling Coefficient (k) | 0.102 | | 0.095 | |

As seen in Table 1, DC resistances (Rdc) of the first and second coils of the coil component according to Inventive Example 1 coincide with those of the first and second coils of the coil component according to Comparative Example 1. The reason is that the DC resistances of the first and second coils are determined by three factors such as specific resistances defined by materials, or the like, of the first and second coils, areas of the first and second coils, and lengths of the first and second coils, and the first and second coils used in Inventive Example 1 are the same as the first and second coils used in Comparative Example 1.

In Table 1, levels of self-inductance of the first and second coils of the coil component according to Inventive Example 1 are increased as compared to those of the first and second coils of the coil component according to Comparative Example 1 by about 10%. The reason is that the coil component according to Inventive Example 1 has a structure in which the first and second coils are enclosed, respectively, by the first and second magnetic regions having the higher levels of magnetic permeability than that of the magnetic body.

In addition, in Table 1, it may be appreciated that a coupling coefficient of the coil component according to Inventive Example 1 is decreased as compared to that of the coil component according to Comparative Example 1 by about 7%. The reason is that a magnetic flux leaked from the first coil to the second coil is decreased, such that a mutual inductance between the first and second coils is decreased, and a magnetic flux leaked from the second coil to the first coil is decreased, such that a mutual inductance between the first and second coils is decreased.

In a case of the coil component according to an exemplary embodiment in the present disclosure, as seen in Table 1, the coupling coefficient of the coil component may be decreased, such that a voltage rise phenomenon may be prevented in a micro-current region.

Board Having Coil Component

Figure 6:
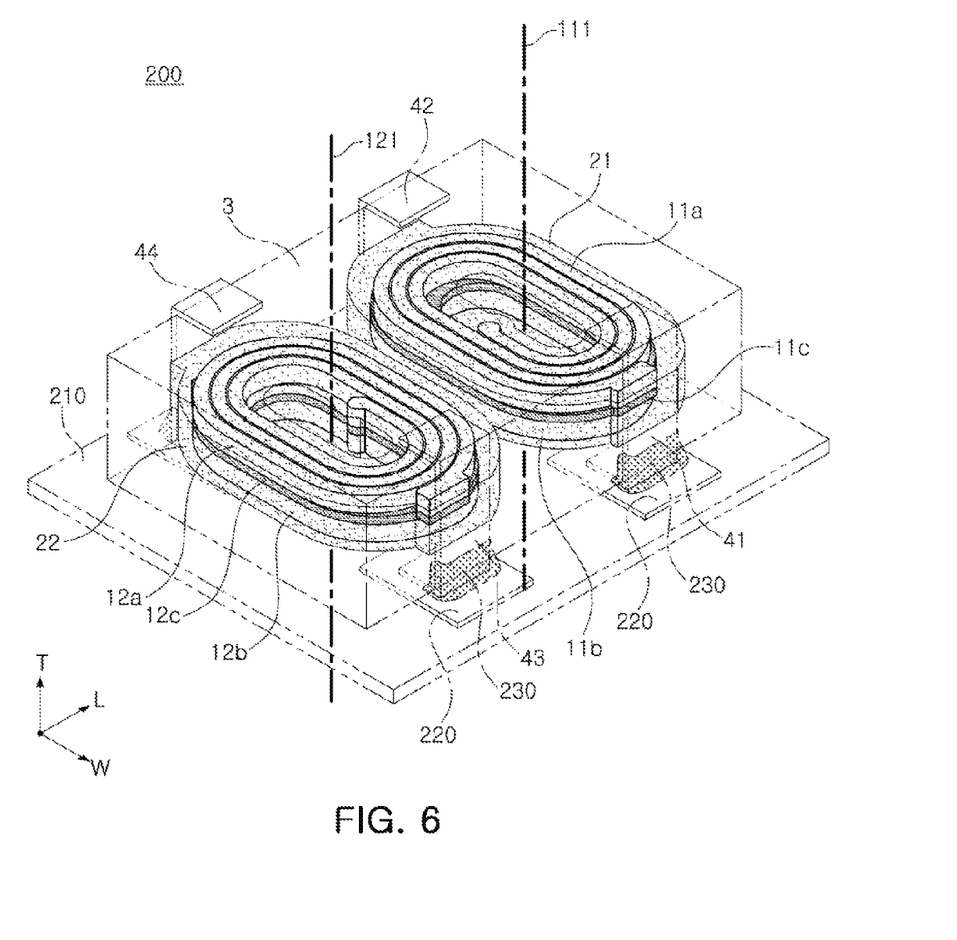
FIG. 6 is a perspective view illustrating an exemplary embodiment in which the coil component of FIG. 2 is mounted on a board.

FIG. 6 is a schematic perspective view illustrating an exemplary embodiment in which the coil component of FIG. 2 is mounted on a board.

Referring to FIG. 6, a board 200 having a coil component according to an exemplary embodiment in the present disclosure may include a printed circuit board 210 on which the coil component 100 is mounted to be parallel to the printed circuit board and a plurality of electrode pads 220 formed on an upper surface of the printed circuit board 210 to be spaced apart from each other.

In this case, a phrase 'coil component is mounted to be parallel to the printed circuit board' means that the first magnetic core 111 of the first coil 11 and the second magnetic core 121 of the second coil 12 in the coil component are formed to be perpendicular to the upper surface of the printed circuit board 210.

The first to fourth external electrodes 41 to 44 of the coil component may be electrically connected to the printed circuit board 210 by solders 230 in a state in which they are positioned on the electrode pads 220, respectively, to contact the electrode pads 220, respectively.

Descriptions of features overlapped with those of the coil component according to the exemplary embodiments in the present disclosure described above except for the abovementioned description will be omitted.

As set forth above, according to exemplary embodiments in the present disclosure, a coil component in which at least two coils are disposed to be spaced apart from each other to significantly decrease an influence of magnetic fluxes between the coils may be provided. In this case, the leakage inductance ($L_L$) of the coils may be increased, while the mutual inductance ('Lm') may be decreased.

In addition, according to an exemplary embodiment in the present disclosure, the self-inductance (Ls) of the coil component may be increased.

Further, according to an exemplary embodiment in the present disclosure, the coupling coefficient of the coil component may be decreased without increasing a mounting area of the coil component.

Additionally, according to an exemplary embodiment, the voltage rise phenomenon may be prevented in a micro-current region.

While exemplary embodiments have been shown and described above, it will be apparent to those skilled in the art that modifications and variations could be made without departing from the scope of the present invention as defined by the appended claims.

What is claimed is:

1. A coil component comprising:
a first coil and a second coil;
a first magnetic region embedding the first coil therein and a second magnetic region embedding the second coil therein;
a magnetic body embedding the first and second magnetic regions therein, wherein permeability of the first and second magnetic regions is higher than that of the magnetic body;
first and second external electrodes disposed on external surfaces of the magnetic body and connected to a first end portion and a second end portion of the first coil, respectively; and
third and fourth external electrodes disposed on the external surfaces of the magnetic body and connected to a first end portion and a second end portion of the second coil, respectively,
wherein the first magnetic region is spaced apart from the second magnetic region and the magnetic body is disposed between the first and second magnetic regions.

2. The coil component of claim 1, wherein the first magnetic region prevents magnetic flux from the first coil from leaking to the second coil, and the second magnetic region prevents magnetic flux from the second coil from leaking to the first coil.

3. The coil component of claim 1, wherein the first magnetic region is disposed to entirely cover external surfaces of the first coil, and the second magnetic region is disposed to entirely cover external surfaces of the second coil.

4. The coil component of claim 1, wherein the first and second magnetic regions have higher levels of magnetic permeability than that of the magnetic body.

5. The coil component of claim 1, wherein a first magnetic core of the first coil is filled with a magnetic material used in forming the magnetic body, and a second magnetic core of the second coil is filled with a magnetic material used in forming the magnetic body.

6. The coil component of claim 1, wherein the first and second magnetic regions and the magnetic body contain an organic resin containing metal based soft magnetic powder particles, and the magnetic powder particles contained in the first and second magnetic regions have higher levels of magnetic permeability than that of magnetic powder particles contained in the magnetic body.

7. The coil component of claim 1, wherein the first coil includes a first coil pattern disposed on a first surface of a first substrate and a second coil pattern disposed on a second surface of the first substrate opposing the first surface of the first substrate, the first coil pattern being connected to the first external electrode, and the second coil pattern being connected to the second external electrode, and
the second coil includes a third coil pattern disposed on a first surface of a second substrate and a fourth coil pattern disposed on a second surface of the second substrate opposing the first surface of the second substrate, the third coil pattern being connected to the third external electrode, and the fourth coil pattern being connected to the fourth external electrode.

8. The coil component of claim 1, wherein the first and third external electrodes are input terminals, and the second and fourth external electrodes are output terminals.

9. The coil component of claim 1, wherein the first and second magnetic regions contain an organic resin containing metal based soft magnetic powder particles.

10. The coil component of claim 9, wherein the organic resin is a thermoplastic resin or a thermosetting resin.

11. The coil component of claim 9, wherein the organic resin includes at least one selected from the group consisting of benzocyclobutene (BCB), an epoxy resin, a phenol resin, a vinyl ester resin, a polyimide (PI) resin, a polyvinyl benzyl ether resin, a polyethylene (PE) resin, a polypropylene (PP) resin, a polybutene resin, and a polyvinyl alcohol resin.

12. The coil component of claim 9, wherein the metal based soft magnetic powder contains one or more selected from the group consisting of iron (Fe), silicon (Si), boron (B), chrome (Cr), aluminum (Al), copper (Cu), niobium (Nb), and nickel (Ni).

13. The coil component of claim 9, wherein the magnetic powder particles are spherical powder particles or flake-shaped powder particles.

14. The coil component of claim 7, wherein the first coil pattern is connected to the second coil pattern by a via penetrating through the first substrate, and the third coil pattern is connected to the fourth coil pattern by a via penetrating through the second substrate.

15. The coil component of claim 7, wherein the first substrate includes a through-hole forming a first magnetic core of the first coil, and the second substrate includes a through-hole forming a second magnetic core of the second coil.

16. The coil component of claim 15, wherein the through-holes formed in the first and second substrates of the first and second coils are filled with an organic resin contained in the magnetic body and contain metal based soft magnetic powder particles as a filler.

17. A board having a coil component, comprising:
a printed circuit board having a plurality of electrode pads disposed thereon; and
the coil component installed on the printed circuit board, wherein the coil component includes:
a first coil and a second coil;
a first magnetic region embedding the first coil therein and a second magnetic region embedding the second coil therein; and
a magnetic body embedding the first and second magnetic regions therein, wherein permeability of the first and second magnetic regions is higher than that of the magnetic body,
wherein the first magnetic region is spaced apart from the second magnetic region and the magnetic body is disposed between the first and second magnetic regions.

18. The board having a coil component of claim 17, wherein the first magnetic region prevents magnetic flux from the first coil from leaking to the second coil, and the second magnetic region prevents magnetic flux from the second coil from leaking to the first coil.

19. The board having a coil component of claim 17, wherein the first and second magnetic regions have higher levels of magnetic permeability than that of the magnetic body.

* * * * *